(12) United States Patent
Wu

(10) Patent No.: US 11,353,787 B2
(45) Date of Patent: Jun. 7, 2022

(54) PHOTOMASK FOR MANUFACTURING ACTIVE SWITCH AND METHOD FOR MANUFACTURING DISPLAY PANEL

(71) Applicant: HKC CORPORATION LIMITED, Shenzhen (CN)

(72) Inventor: Chuan Wu, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 499 days.

(21) Appl. No.: 16/349,986

(22) PCT Filed: Dec. 4, 2018

(86) PCT No.: PCT/CN2018/119061
§ 371 (c)(1),
(2) Date: May 15, 2019

(87) PCT Pub. No.: WO2020/103187
PCT Pub. Date: May 28, 2020

(65) Prior Publication Data
US 2022/0004095 A1 Jan. 6, 2022

(30) Foreign Application Priority Data

Nov. 21, 2018 (CN) .......................... 201811389226.X

(51) Int. Cl.
*G03F 1/54* (2012.01)

(52) U.S. Cl.
CPC ...................................... *G03F 1/54* (2013.01)

(58) Field of Classification Search
CPC ......................................................... G03F 1/54
USPC ............................................................. 430/5
See application file for complete search history.

(56) References Cited

FOREIGN PATENT DOCUMENTS

| CN | 101231458 A | 7/2008 |
|---|---|---|
| CN | 101598894 A | 12/2009 |
| CN | 101943854 A | 1/2011 |
| CN | 203658725 U | 6/2014 |
| CN | 107132724 A | 9/2017 |
| KR | 20080032290 A | 4/2008 |

OTHER PUBLICATIONS

Shufeng Tian, the ISA written comments, Jul. 2019, CN.

*Primary Examiner* — Christopher G Young

(57) ABSTRACT

The present application discloses a photomask for manufacturing an active switch and a method for manufacturing a display panel. The photomask includes a light shielding region, a semi-transmissive region, a light transmitting region and a hollowed-out region, where the light shielding region corresponds to a metal layer of the active switch and is configured to be lighttight; the semi-transmissive region corresponds to a channel region of the active switch, and is configured to be partially transmissive; the light transmitting region is a photomask region other than the light shielding region and the semi-transmissive region and is configured to be completely transmissive; and the hollowed-out region is located within the semi-transmissive region and is configured to be completely transmissive.

16 Claims, 9 Drawing Sheets

PHOTOMASK FOR MANUFACTURING ACTIVE SWITCH AND METHOD FOR MANUFACTURING DISPLAY PANEL

The present application claims the priority to the Chinese Patent Application No. CN201811389226.X, filed to the National Intellectual Property Administration, PRC on Nov. 21, 2018, and entitled "PHOTOMASK FOR MANUFACTURING ACTIVE SWITCH AND METHOD FOR MANUFACTURING DISPLAY PANEL", which is incorporated herein by reference in its entirety.

TECHNICAL FIELD

The present application relates to the field of display technologies, and in particular, to a photomask for manufacturing an active switch and a method for manufacturing a display panel.

BACKGROUND

The description herein merely provided background information related to the present application and does not necessarily constitute the prior art.

A four-step manufacturing process is commonly applied in the production of a display panel. A function thereof is to combine an amorphous silicon layer and a data line or a source/drain metal layer into a photomask; compared to a traditional five-step manufacturing process, the four-step manufacturing process reduces a lithography process, which can improve production efficiency. Each photomask manufacturing process of the four-step manufacturing process includes steps of exposure, development, etch, and photoresist stripping; in the actual production process, light affects the exposure quality of an active switch due to a certain scattering effect thereof.

An arc-shaped channel region of the active switch defocuses during the exposure.

SUMMARY

An objective of the present application is to provide a photomask for manufacturing an active switch and a method for manufacturing a display panel to improve defocusing during exposure at a channel.

To achieve the above objective, the present application provides a photomask for manufacturing an active switch, including a light shielding region, a semi-transmissive region, a light transmissive region and a hollowed-out region; where the light shielding region corresponds to a metal layer of the active switch and is configured to be lighttight. The semi-transmissive region corresponds to a channel region of the active switch and is configured to be partially transmissive. The light transmissive region is a photomast region other than the light shielding region and the semi-transmissive region, and is configured to be completely transmissive. The hollowed-out region is located within the semi-transmissive region and configured to be completely transmissive.

Optionally, the hollowed-out region includes a hollowed-out structure, the hollowed-out structure being provided as a slit.

Optionally, the slit is linear.

Optionally, the number of the slits is a plurality, and the plurality of extension lines of the slits intersect at a same intersection.

Optionally, the plurality of slits are evenly distributed in the semi-transmissive region.

Optionally, the hollowed-out region includes a hollowed-out structure, the hollowed-out structure is in an arc shape.

Optionally, the hollowed-out region includes a hollowed-out structure, and the hollowed-out structure is polygonal.

Optionally, the hollowed-out structure is arranged as a circular hole.

Optionally, the circular holes are evenly distributed in the semi-transmissive region.

Optionally, the slit has a width of at least 0.1 micron.

Optionally, the slit has the width of no more than 2 microns.

Optionally, the metal layer includes a source metal layer and a drain metal layer; the light shielding region includes a first light shielding region and a second light shielding region, the first light shielding region corresponds to the drain metal layer; the second light shielding region corresponds to the source metal layer; and the hollowed-out region connects the first light shielding region with the second light shielding region.

Optionally, the semi-transmissive region includes a semicircular region and a linear region, the hollowed-out region is located within the semicircular region.

Optionally, the semi-transmissive region has a width of at least 2.8 microns.

Optionally, the semi-transmissive region has the width of no more than 5 microns.

The present application still provides a photomask for manufacturing an active switch, including a light shielding region, a semi-transmissive region, and a light transmitting region; the light shielding region corresponds to a metal layer of the active switch and is configured to be lighttight; the semi-transmissive region corresponds to a channel region of the active switch and is configured to be partially transmissive; the light transmitting region is a photomask region other than the light shielding region and the semi-transmissive region, and configured to be completely transmissive; the hollowed-out region is located within the semi-transmissive region and configured to be completely transmissive; the hollowed-out region includes a hollowed-out structure, the hollowed-out structure is arranged as a slit, and the slit is linear; the slit has a width of at least 0.1 micrometer and no more than 2 micrometers; the metal layer includes a source metal layer and a drain metal layer; the light shielding region includes a first light shielding region and a second light shielding region, the first light shielding region corresponds to the drain metal layer; the second light shielding region corresponds to the source metal layer; the hollowed-out region connects the first light shielding region with the second light shielding region; the number of the slits is a plurality, and extension lines of the plurality of slits intersect at a same intersection; the first light shielding region includes a semicircular area, and the intersection is a center of the semicircular area; the semi-transmissive region includes a semicircular region and a linear region, and the hollowed-out region is located within the semicircular region; the plurality of slits are evenly distributed in the semi-transmissive region; the semi-transmissive region has a width of at least 2.8 microns and no more than 5 microns.

The present application still provides a method for manufacturing a display panel, and the display panel includes:

a substrate, and an active switch, formed on the substrate;

the method for manufacturing the display panel includes a step of:

manufacturing the active switch by using a photomask for manufacturing the active switch.

Compared with a solution in which the hollowed-out region is not provided in the semi-transmissive region of the photomask for manufacturing the active switch, the present application provides the hollowed-out region on the semi-transmissive region; compared with an exemplary technology, the hollowed-out region can increase the amount of the light transmitting through the semi-transmissive region, thereby reducing defocus during exposure and improving a process yield.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

Figure 1:
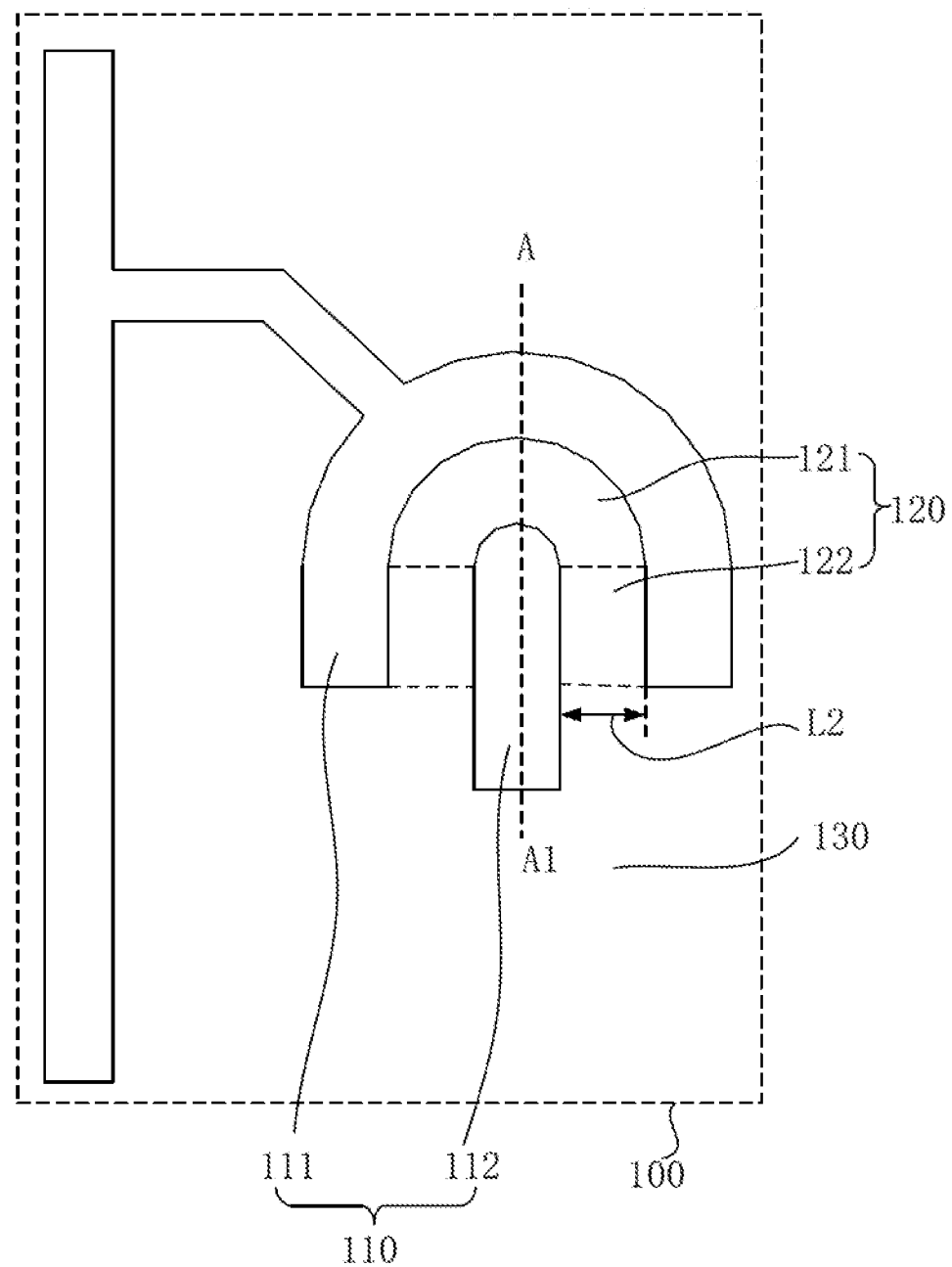
FIG. 1 is a schematic diagram of a photomask for manufacturing an active switch according to an exemplary technology.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left". "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically or electrically connected; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

In the drawings, similar structures are denoted by the same reference numbers.

As shown in FIG. 2 to FIG. 12, an embodiment details a photomask for manufacturing an active switch of the present application.

A photomask 100 for manufacturing the active switch 220 includes a light shielding region 110, a semi-transmissive region 120, a light transmitting region 130 and a hollowed-out region 140, the light shielding region 110 corresponds to a metal layer 221 of the active switch 220 and is configured to be lighttight; the semi-transmissive region 120 corresponds to a channel region 224 of the active switch 220 and is configured to be partially transmissive; the light transmitting region 130 is a photomask region 100 other than the light shielding region 110 and the semi-transmissive region 120 and is configured to be completely transmissive; the hollowed-out region 140 is located within the semi-transmissive region 120 and configured to be completely transmissive.

In this solution, the semi-transmissive region 120 is provided thereon with the hollowed-out region 140, and the hollowed-out region 140 can increase the amount of the light transmitting through the semi-transmissive region 120, thereby reducing defocus during exposure and hence improving a process yield.

Compared with the solution shown in FIG. 1, on the semi-transmissive region 120 of the photomask region 100 of the active switch 220, there is no hollowed-out region 140 and other settings to increase the amount of light transmittance, while the solution provides a hollowed-out region 140 on the semi-transmissive region 120, and the hollow-out region 140 can increase the transmittance of the semi-transmissive region 120. This can reduce the exposure of the phenomenon of defocusing, improve the yield of the process.

The display panel 300 includes an array substrate 200, and the array substrate 200 for making active switch 220 includes a substrate 210, a first metal layer 230, a gate insulation layer 240, an active layer 250, an ohmic contact layer 260, a second metal layer 270 and a photoresist layer 280. The first metal layer 230 is formed on the substrate 210, the gate insulating layer 240 is formed on the first metal layer 230, the active layer 250 is formed on the gate insulation layer 240, the ohmic contact layer 260 is fornied on the active layer 250, and the second metal layer 270 is formed on the ohmic contact layer 260. The photoresist layer 280 is formed on the second metal layer 270.

Figure 2:
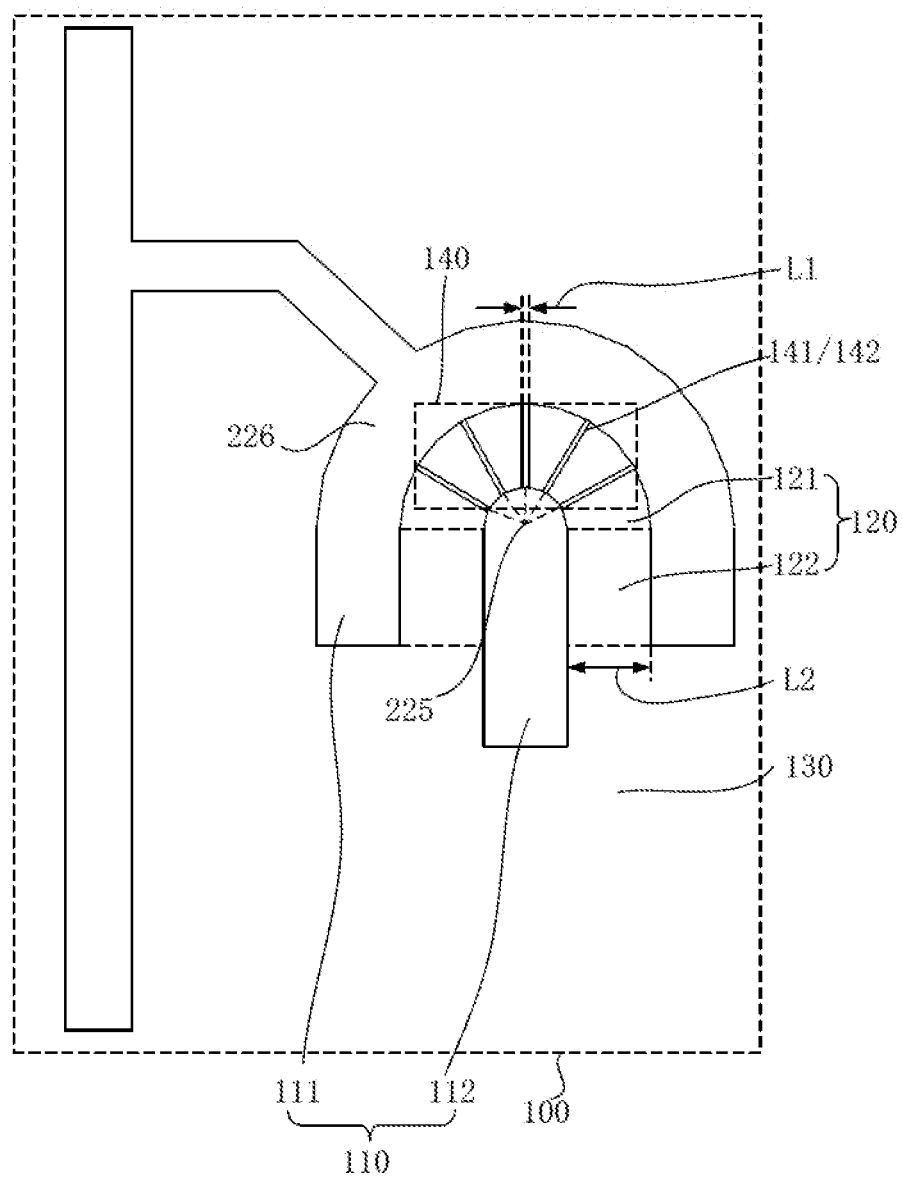
FIG. 2 is a schematic diagram of a photomask for manufacturing an active switch according to an embodiment of the present application.

In an embodiment, as shown in FIG. 2, the hollowed-out region 140 includes a hollowed-out structure 142, and the hollowed-out structure 142 is arranged as a slit 141.

In this solution, the hollowed-out structure 142 in the hollowed-out region 140 is arranged as the slit 141, and the slit 141 can increase the amount of the light transmitting through the semi-transmissive region 120, and may not be exposed at the same time, thereby reducing the defocus during the exposure and hence improving the process yield.

In an embodiment, as shown in FIG. 2, the slit 141 is linear.

In this solution, the slit 141 is arranged as a linear shape, and can allow linear light to pass through, thereby reducing defocus during the exposure and hence improving the process yield.

In an embodiment, as shown in FIG. 2, the number of the slits 141 is a plurality, and extension lines of the plurality of slits 141 intersect at a same intersection.

In this solution, the number of the slits 141 is a plurality, which can increase the amount of the light transmitting through the semi-transmissive region 120, thereby better reducing the defocus during the exposure; and the extension lines of the plurality of slits 141 intersect at a same intersection, so that the slit 141 is standardized to facilitate the manufacturing thereof, thereby improving the process yield.

In an embodiment, as shown in FIG. 2, a plurality of slits 141 are evenly distributed within the semi-transmissive region 120.

In this solution, the plurality of the slits 141 are evenly distributed in the semi-transmissive region 120, so that the amount of the light transmitting through the semi-transmissive region 120 can be evenly increased, thereby stably and evenly reducing the defocus during the exposure and improving the process yield.

In an embodiment, the hollowed-out region 140 includes the hollowed-out structure 142, and the hollowed-out structure 142 can be in an arc shape, in a polygonal shape, or in other shapes.

In this solution, according to the specific use requirements, the hollowed-out structure 142 may have any shape, which can reduce the defocus during the exposure correspondingly and hence improve the process yield.

Figure 3:
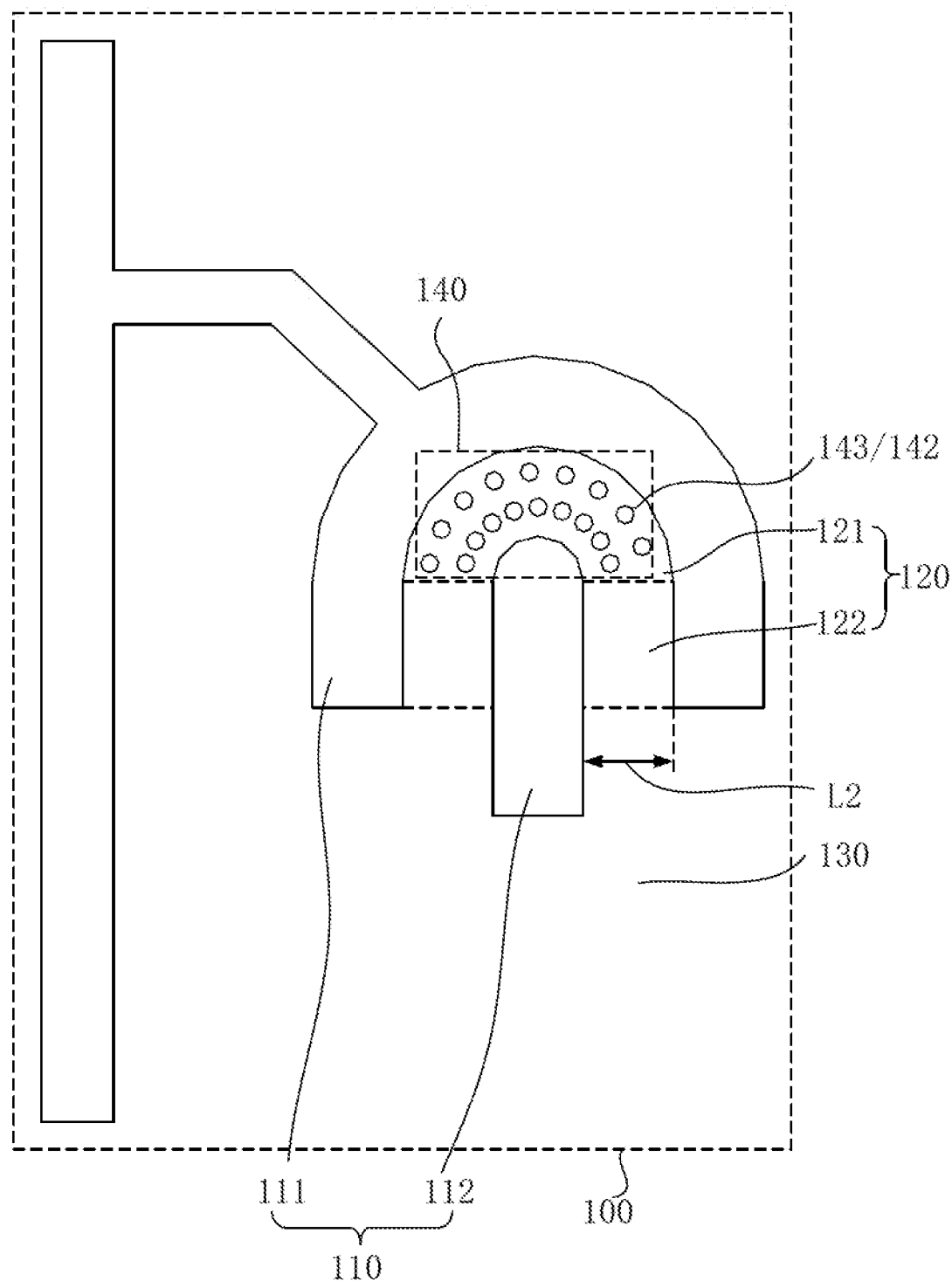
FIG. 3 is a schematic diagram of a photomask for manufacturing an active switch according to another embodiment of the present application.
Figure 4:
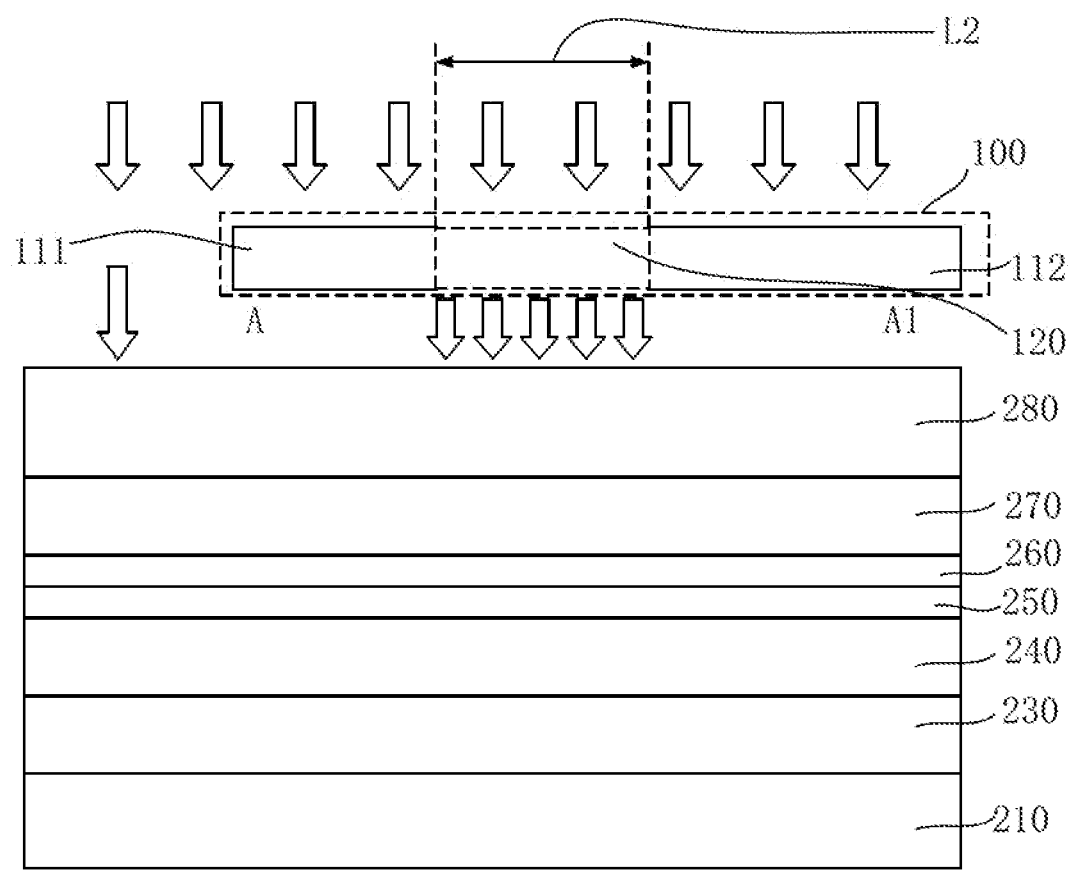
FIG. 4 is a schematic diagram of the principle of exposure of a cross section A-A1 of FIG. 1 according to an embodiment of the present application.
Figure 5:
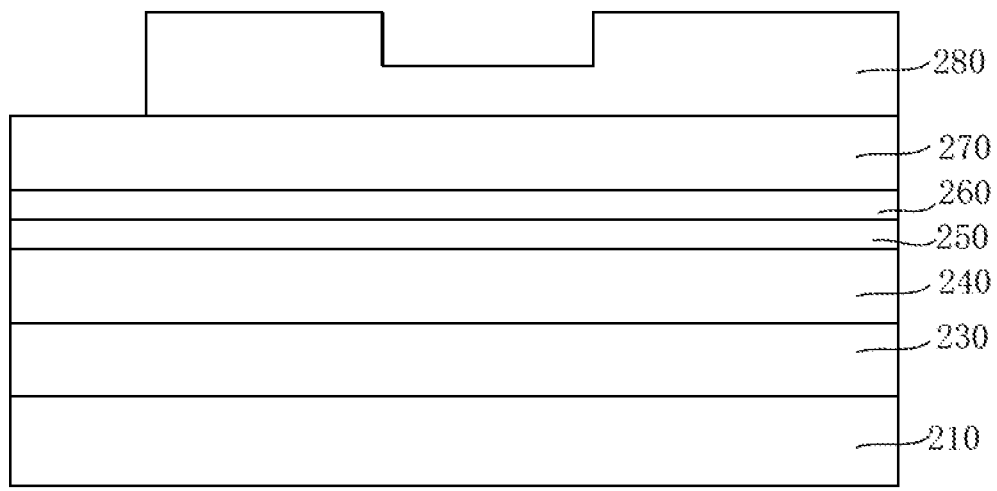
FIG. 5 is a schematic diagram of an embodiment of the present application after exposure and development.
Figure 6:
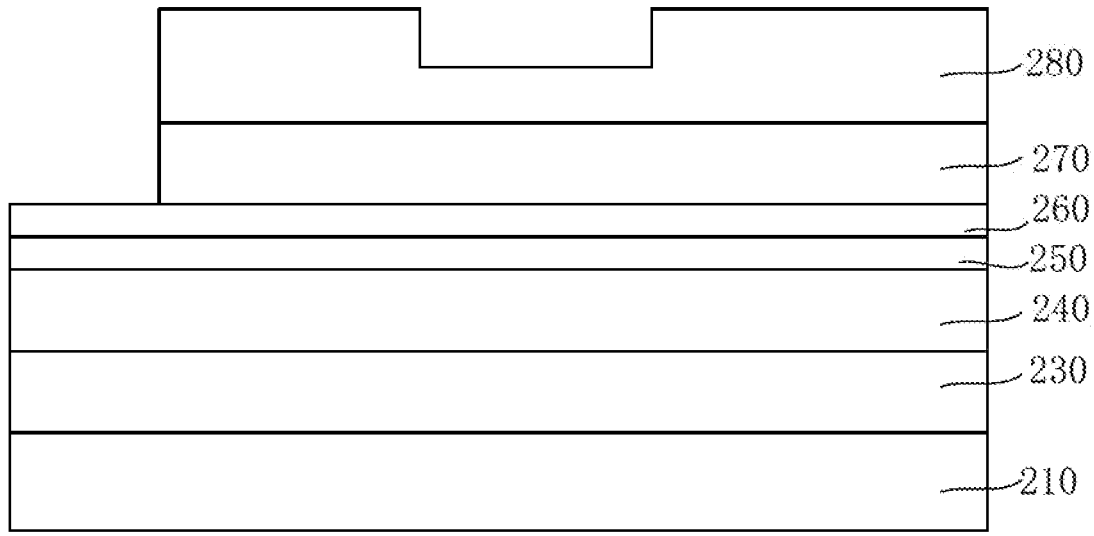
FIG. 6 is a schematic diagram of an embodiment of the present application after a first wet etch.
Figure 7:
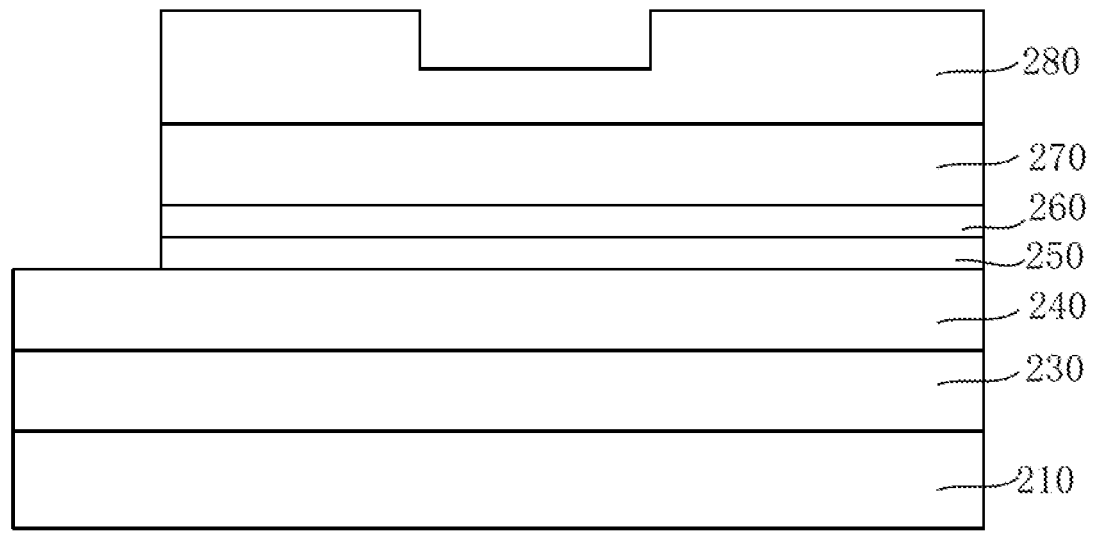
FIG. 7 is a schematic diagram of a first dry etch according to an embodiment of the present application.
Figure 8:
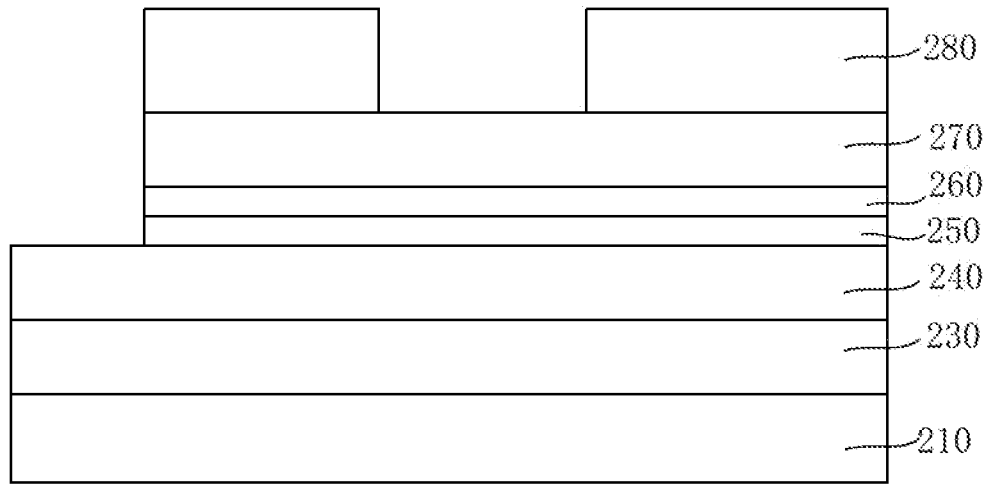
FIG. 8 is a schematic diagram of photoresist ashing according to an embodiment of the present application.
Figure 9:
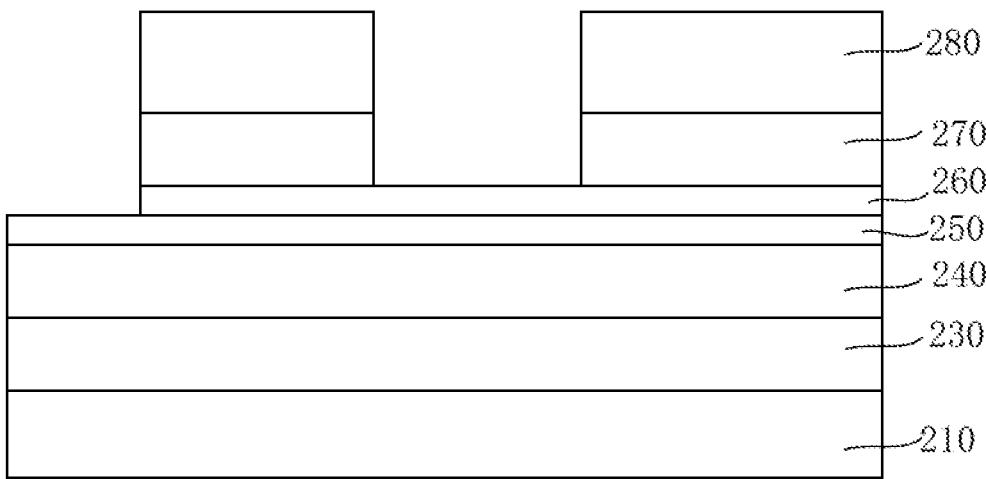
FIG. 9 is a schematic diagram of a second wet etch according to an embodiment of the present application.
Figure 10:
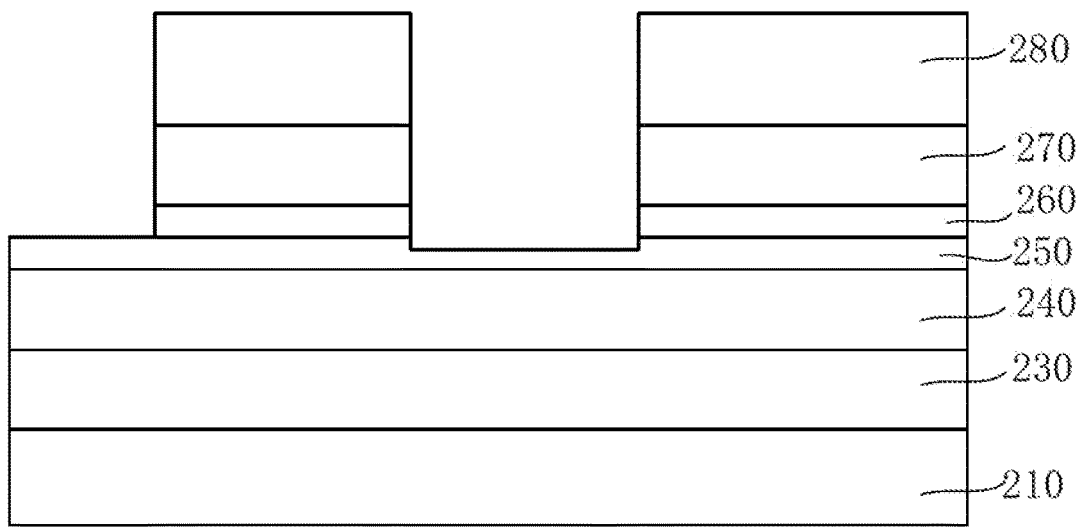
FIG. 10 is a schematic diagram of a second dry etch of an embodiment of the present application.
Figure 11:
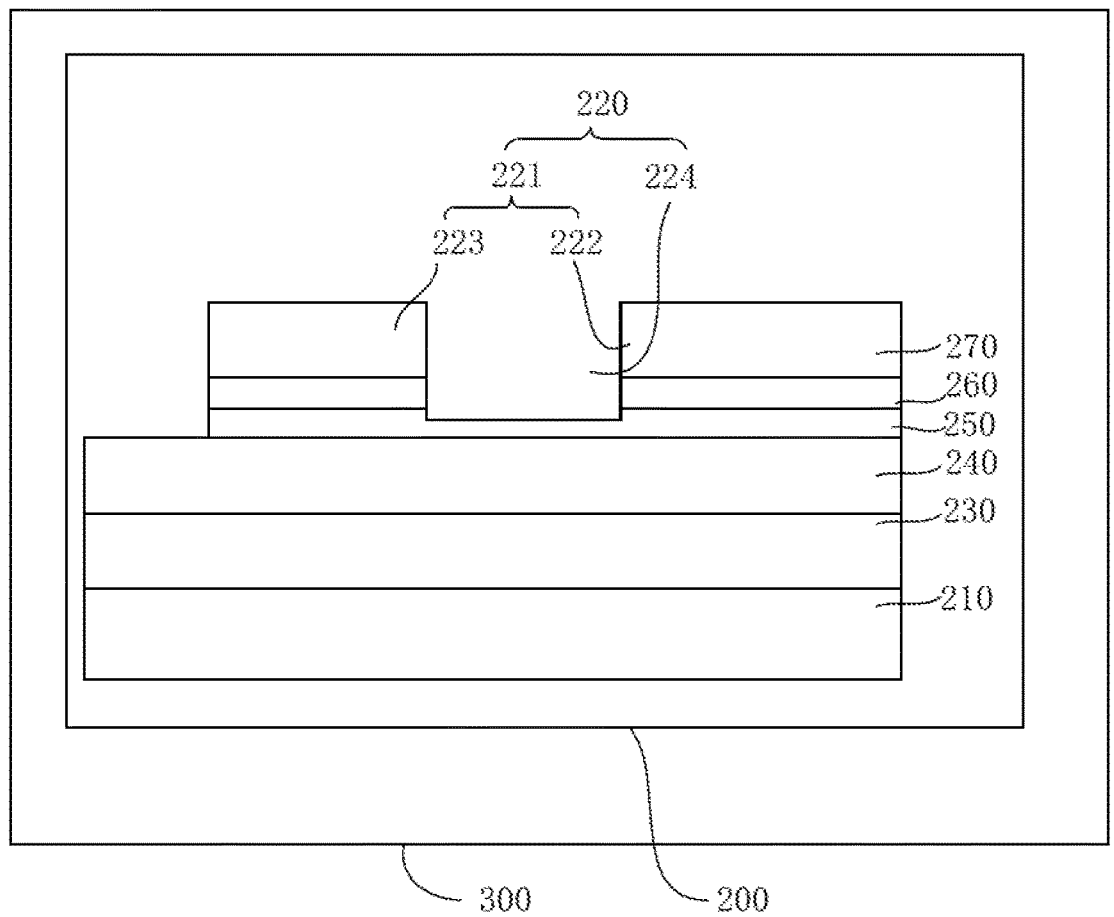
FIG. 11 is a schematic diagram of the formation of a complete channel after a photoresist is shipped according to an embodiment of the present application.

In an embodiment, as shown in FIG. 3, the hollowed-out structure 142 is arranged as circular holes 143, and the circular holes 143 are evenly distributed in the semi-transmissive region 120.

In this solution, if the circular holes 143 have the same dimension in any direction, the light transmitting through the circular holes 143 is even in any direction; according to the light transmissive characteristics of the circular holes 143, in this solution, the hollowed-out structure 142 is arranged as the circular holes 143, and the circular holes 143 are evenly distributed in the semi-transmissive region 120, so that the amount of light transmitted through the semi-transmissive region 120 can be evenly increased, thereby reducing the defocus during the exposure and hence improving the process yield.

In an embodiment, as shown in FIG. 2, the slit 141 has a width L1 of at least 0.1 micrometers and no more than 2 micrometers.

In this solution, since an exposure machine has the precision of about 2 micrometers, when a width L1 of the slit 141 is arranged to be at least 0.1 micrometer and no more than 2 micrometers, the exposure thereof usually does not occur, so that the amount of the light transmitting through the semi-transmissive region 120 is increased, thereby reducing the defocus during the exposure and improve the process yield.

Figure 12:
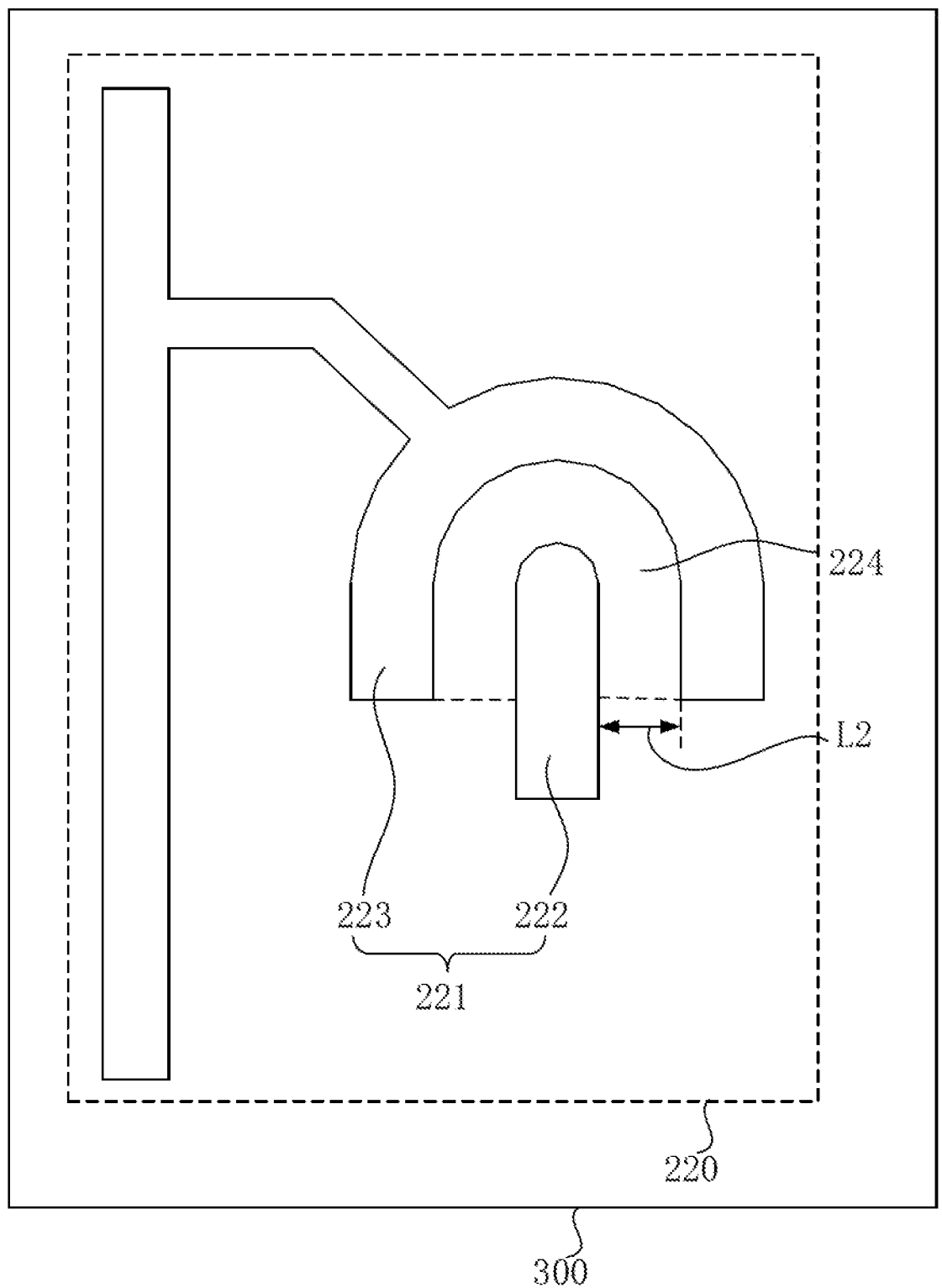
FIG. 12 is a top view of an active switch forming a complete channel after a photoresist is stripped in FIG. 11 according to the present application.
Figure 13:
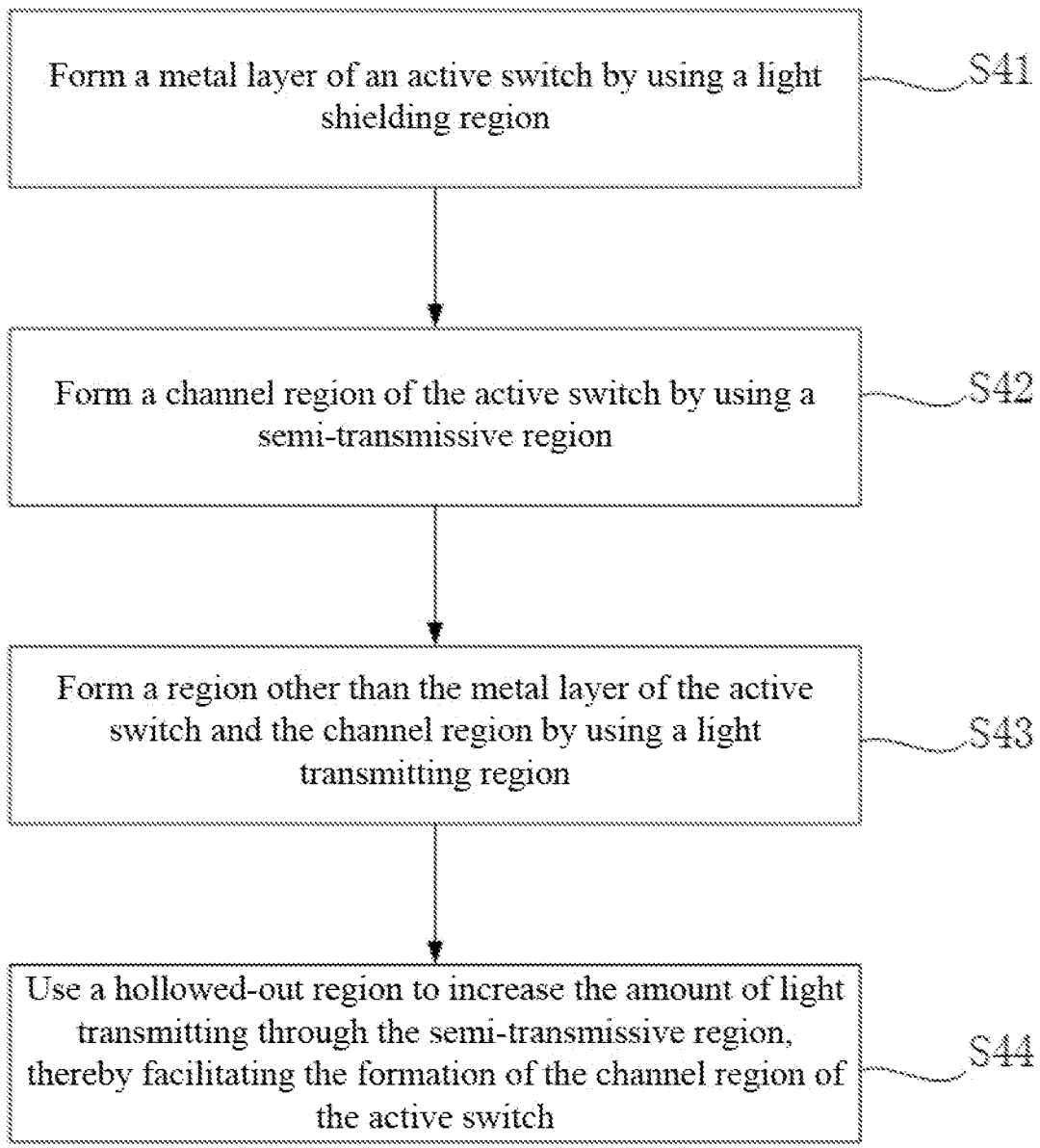
FIG. 13 is a schematic diagram of a flow of a method for manufacturing a display panel according to an embodiment of the present application.

In an embodiment, as shown in FIG. 2 and FIG. 12, the metal layer 221 includes a source metal layer 222 and a drain metal layer 223; the light shielding region 110 includes a first light shielding region 111 and a second light shielding region 112, and the first light shielding region 111 corresponds to the drain metal layer 223; the second light-shielding region 112 corresponds to the source metal layer 222; the hollowed-out region 140 connects the first light-shielding region 111 with the second light-shielding region 112.

In this solution, the hollowed-out region 140 is arranged to connect the first light-shielding region 111 with the second light-shielding region 112 and has the same width as that of the semi-transmissive region 120, so that the light transmission range of the semi-transmissive region 120 can facilitate a width direction, thereby better reducing the defocus during the exposure and improving the process yield.

In an embodiment, as shown in FIGS. 2 and 3, the semi-transmissive region 120 includes a semicircular region 121 and a linear region 122, and the hollowed-out region 140 is located within the semicircular region 121.

In this solution, since the semicircular region 121 is surrounded by the light shielding region 110 and the semi-transmissive region 120, and the linear region 122 is adjacent to the light transmitting region 130, the semicircular region 121 may have a certain probability of defocusing due to a certain scattering effect of the light in a manufacturing process when it is ensured that the linear region 122 can complete the exposure, and therefore, the semicircular region 121 is provided therein with the hollowed-out region 140, which can increase the amount of light transmitted through the semicircular region 121, thereby reducing the defocus during the exposure and improving the process yield.

In an embodiment, as shown in FIGS. 2 and 12, the semi-transmissive region 120 has a width L2 of at least 2.8 microns and no more than 5 microns.

In this solution, the width L2 of the semi-transmissive region 120 is arranged to be at least 2.8 micrometers and no more than 5 micrometers. An active switch produced in this way has a conduction current that satisfies a working range.

As shown in FIG. 2 and FIG. 12, a photomask 100 for manufacturing an active switch 220 is disclosed. The photomask 100 includes a light shielding region 110, a semi-transmissive region 120, a light transmitting region 130 and a hollowed-out region 140, the light shielding region 110 corresponds to a metal layer 221 of the active switch 220 and is configured to be lighttight; the semi-transmissive region 120 corresponds to a channel region 224 of the active switch 220, and is configured to be partially transmissive; the light-transmitting region 130 is a photomask region 100 other than the light-shielding region 110 and the semi-transmissive region and is configured to be completely transmissive; the hollowed-out region 140 is located within the semi-transmissive region 120 and configured to be completely transmissive; the hollowed-out region 140 includes a hollowed-out structure 142, and the hollow structure 142 is configured as a slit 141, the slit 141 is linear; the slit 141 has a width L1 greater than or equal to 0.1 micrometer and no more than 2 micrometers; the metal layer 221 includes a source metal layer 222 and a drain metal layer 223; the light shielding region 110 includes a first light shielding region and a second light shielding region, the first light-shielding region 111 corresponds to the drain metal layer 223; the second light-shielding region 112 corresponds to the source metal layer 222; the hollowed-out region 140 connects the first light-shielding region 111 with the second light-shielding region 112; the number of the slits 141 is a plurality, the extension lines of the plurality of slits 141 intersect at the same intersection; the first light-shielding region 111 includes a semicircular region 225, the intersection thereof is a center 226 of the semicircular region; the semi-transmissive region 120 includes a semicircular region 121 and a linear region 122, and the hollowed-out region 140 is located within the semicircular region 121, the plurality of the slits 141 are evenly distributed in the semi-transmissive region 120; the semi-transmissive region 120 has a width L2 of at least 2.8 microns and no more than 5 microns.

In this solution, the hollowed-out region 140 is arranged on the semi-transmissive region 120; compared with an exemplary technology, the hollowed-out region 140 can increase the amount of the light transmitting through the semi-transmissive region 120, thereby reducing defocus during exposure and improving a process yield; the hollowed-out structure 142 in the hollowed-out region 140 is arranged as the slit 141, the slit 141 can increase the amount of the light transmitting through the semi-transmissive region 120, and may not be exposed, and the slit is linear and can allow linear light to pass through; since an exposure machine has the precision of about 2 microns, when a width L1 of the slit 141 is arranged to at least 0.1 micrometer and no more than 2 micrometers, exposure thereof usually does not occur, so that the amount of the light transmitting through the semi-transmissive region 120 is increased, thereby reducing the defocus during the exposure and improving the process yield; the hollowed-out region 140 is arranged to connect the first light-shielding region 111 with the second light-shielding region 112, and has the width the same as that of the semi-transmissive region 120, so that the light transmission range of the light transmissive region 120 can better facilitate a width direction, which can better reduce the defocus during the exposure and improve the process yield; the number of the slits 141 is a plurality, so that the amount of the light transmitting through the semi-transmissive region 120 can be increased, thereby better reducing the defocus during the exposure; the extension lines of the plurality of slits 141 intersect at the same intersection, so the slit 141 can be standardized for manufacturing thereof, thereby better improving the process yield; since the semicircular region 121 is surrounded by the light shielding region 110 and the semi-transmissive region 120, and the linear region 122 is adjacent to the light-transmitting region 130, the semicircular region 121 can have a certain probability of defocusing due to a certain scattering effect of the light in a manufacturing process when it is ensured that the linear region 122 can complete the exposure of a semi-transmissive region, therefore, the hollowed-out region 140 is provided within the semi-circular region 121, which can increase the amount of the light transmitting through the semi-circular region 121, thereby reducing the defocus of the exposure and improving the process yield; the plurality of the slits 141 are evenly distributed in the semi-transmissive region 120, so that the amount of the light transmitting through the semi-transmissive region 120 can be evenly increased, thereby stably and evenly reducing the defocus during the exposure and improving the process yield; the width L2 of the semi-transmissive region 120 is arranged to be at least 2.8 micrometers, and no more than 5 micrometers, and thus, the active switch produced in this way has a conduction current that satisfies a working range.

As shown in FIG. 2 to FIG. 13, a method for manufacturing a display panel 300 is disclosed; the display panel 300 includes a substrate 210 and an active switch 220, and the active switch 220 is formed on the substrate 210.

The method for manufacturing the display panel 300 includes manufacturing the active switch 220 by using a photomask 100 for manufacturing the active switch 220.

More specifically, the method for manufacturing the display panel 300 includes steps of:

S41: Form a metal layer 221 of the active switch 220 by using a light shielding region 110.

S42: Form a channel region 224 of the active switch 220 by using the semi-transmissive region 120.

S43: Form other region other than the metal layer 221 of the active switch 220 and the channel region 224 by using the light transmitting region.

S44: Use a hollowed-out region 140 to increase the amount of light transmitting through the semi-transmissive region 120, thereby facilitating the formation of the channel region 224 of the active switch 220.

It should be noted that the definition of each step involved in the present application is not determined to limit the sequence of steps without affecting the implementation of the specific solution, and the steps written in the foregoing may be performed first and can also be executed later, or even at the same time, as long as the solution can be implemented, it should be considered as belonging to the scope of protection of the present application.

The technical solution of the present application can be widely applied in various display panels, such as a twisted nematic (TN) display panel, a vertical alignment (VA) display panel, etc. Of course, the display panels may also be other types of display panels, such as an organic light-emitting diode (OLED) display panel, which can be suitable for the above solution.

The above is a detailed description of the present application in conjunction with the specific optional embodiments, and it cannot be considered that the specific implementation of the present application is limited to the description. A plurality of simple deductions or replacements can also be performed without departing from the conception of the present application by a person of ordinary skill in the art which the present application belongs to, which should be regarded as belonging to the scope of protection of the present application.

What is claimed is:

1. A photomask for manufacturing an active switch, comprising:
   a light shielding region, corresponding to a metal layer of the active switch and configured to be lighttight;
   a semi-transmissive region, corresponding to a channel region of the active switch and configured to be partially transmissive;
   a light transmitting region being a photomask region other than the light shielding region and the semi-transmissive region, and configured to be completely transmissive; and
   a hollowed-out region, disposed within the semi-transmissive region and configured to be completely transmissive;
   wherein the semi-transmissive region comprises a semi-annular portion and a linear portion joined with each of both ends of the semi-annular portion, wherein the hollowed-out region is disposed within the semi-annular portion.

2. The photomask according to claim 1, wherein the hollowed-out region comprises at least one hollowed-out structure, each hollowed-out structure being a slit.

3. The photomask according to claim 2, wherein the slit is linear.

4. The photomask according to claim 3, wherein the number of the slits is a plurality, and extension lines of the plurality of slits intersect at a common point.

5. The photomask according to claim 2, wherein the plurality of slits are evenly distributed in the semi-transmissive region.

6. The photomask according to claim 1, wherein the hollowed-out region comprises at least one hollowed-out structure, each hollowed-out structure is in an arc shape.

7. The photomask according to claim 1, wherein the hollowed-out region comprises at least one hollowed-out structure, each hollowed-out structure being polygonal.

8. The photomask according to claim 6, wherein each hollowed-out structure is a circular hole.

9. The photomask according to claim 8, wherein the circular holes are evenly distributed in the semi-transmissive region.

10. The photomask according to claim 2, wherein the slit has a width of at least 0.1 micron.

11. The photomask according to claim 2, wherein the slit has the width of no more than 2 microns.

12. The photomask according to claim 1, wherein the metal layer comprises a source metal layer and a drain metal layer; the light shielding region comprises a first light shielding portion and a second light shielding portion, and the first light shielding portion corresponds to the drain metal layer; the second light shielding portion corresponds to the source metal layer; and
the hollowed-out region connects the first light shielding portion with the second light shielding portion.

13. The photomask according to claim 1, wherein the semi-transmissive region has a width of at least 2.8 microns.

14. The photomask according to claim 1, wherein the semi-transmissive region has the width of no more than 5 microns.

15. A photomask for manufacturing an active switch, comprising:
   a light shielding region, corresponding to a metal layer of the active switch and configured to be lighttight;
   a semi-transmissive region, corresponding to a channel region of the active switch and configured to be partially transmissive;
   a light transmitting region, being a photomask region other than the light shielding region and the semi-transmissive region, and configured to be completely transmissive; and
   a hollowed-out region, disposed within the semi-transmissive region and configured to be completely transmissive;
   wherein the hollowed-out region comprises at least one hollowed-out structure, each hollowed-out structure being a slit, which is linear;
   wherein the slit has a width of at least 0.1 micrometer and no more than 2 micrometers;
   wherein the metal layer comprises a source metal layer and a drain metal layer; the light shielding region comprises a first light shielding portion and a second light shielding portion, and the first light shielding portion corresponds to the drain metal layer; and the second light shielding portion corresponds to the source metal layer; the hollowed-out region connects the first light shielding portion with the second light shielding portion;
   wherein the number of the slits is a plurality, and extension lines of the plurality of slits intersect at a common point; the first light shielding portion comprises a semi-annular portion, and the intersection is a center of the semi-annular portion;
   wherein the semi-transmissive region comprises a semi-annular portion and a linear portion joined with each of both ends of the semi-annular portion, and the hollowed-out region is disposed within the semi-annular portion;
   wherein the plurality of the slits are evenly distributed in the semi-transmissive region; and
   wherein the semi-transmissive region has a width of at least 2.8 microns and no more than 5 microns.

16. A method for manufacturing a display panel, the display panel comprising:
   a substrate, and
   an active switch, formed on the substrate;
   wherein the method comprises:
   manufacturing the active switch by using the photomask according to claim 1.

* * * * *